(12) United States Patent
Murata et al.

(10) Patent No.: US 9,094,010 B2
(45) Date of Patent: Jul. 28, 2015

(54) CIRCUIT CONTROL DEVICE

(71) Applicant: DENSO CORPORATION, Kariya, Aichi-pref. (JP)

(72) Inventors: Yuusuke Murata, Kariya (JP); Takeyasu Komatsu, Chiryu (JP); Tsuneo Maebara, Nagoya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/172,415

(22) Filed: Feb. 4, 2014

(65) Prior Publication Data

US 2014/0218074 A1      Aug. 7, 2014

(30) Foreign Application Priority Data

Feb. 4, 2013      (JP) .................................. 2013-019735

(51) Int. Cl.
| | |
|---|---|
| *H03B 1/00* | (2006.01) |
| *H03K 3/00* | (2006.01) |
| *H03K 17/14* | (2006.01) |
| *H03K 17/567* | (2006.01) |

(52) U.S. Cl.
CPC .............. *H03K 17/14* (2013.01); *H03K 17/567* (2013.01)

(58) Field of Classification Search
USPC ................................................. 327/108, 109
See application file for complete search history.

(56) References Cited

U.S. PATENT DOCUMENTS

| | | | |
|---|---|---|---|
| 5,926,012 A | 7/1999 | Takizawa et al. | |
| 7,837,365 B1* | 11/2010 | Sisko | 362/485 |
| 2003/0189836 A1* | 10/2003 | Sparling et al. | 362/485 |
| 2007/0139942 A1* | 6/2007 | Rowland et al. | 362/477 |
| 2009/0261774 A1* | 10/2009 | Yuuki et al. | 318/720 |
| 2010/0231269 A1 | 9/2010 | Nakatake et al. | |
| 2012/0194226 A1 | 8/2012 | Itou et al. | |
| 2013/0078075 A1* | 3/2013 | Francois | 414/800 |
| 2013/0249479 A1* | 9/2013 | Partovi | 320/108 |

(Continued)

FOREIGN PATENT DOCUMENTS

| | | |
|---|---|---|
| JP | 09-023664 | 1/1997 |
| JP | 10-150764 | 6/1998 |
| JP | 11-252896 | 9/1999 |
| JP | 2011-200037 | 10/2011 |
| JP | 2012-157223 | 8/2012 |
| WO | WO 2007/116900 | 10/2007 |

OTHER PUBLICATIONS

Office Action (2 pages) dated Jan. 6, 2015, issued in corresponding Japanese Application No. 2013-019735 and English translation (2 pages).

*Primary Examiner* — Adam Houston
(74) *Attorney, Agent, or Firm* — Nixon & Vanderhye, P.C.

(57) ABSTRACT

In the invention, a circuit control device controlling a semiconductor switching element having a control terminal and driven by voltage inputted to the control terminal, has an input voltage detector, a desired voltage setting portion and a control input generation portion. The input voltage detector detects inputted voltage to the switching element. The desired voltage setting portion sets a desired value of the voltage to be inputted to the switching element. The control input generation portion is connected to the control terminal of the switching element, the control input generation portion generating control input to the switching element such that the value to be detected by the input voltage detector closes to the set desired value. The desired voltage setting portion sets the desired value of the voltage on the basis of predetermined characteristics information and operating parameters of the switching element. The operating parameters include temperature of the switching element, Vce, Ice etc.

8 Claims, 5 Drawing Sheets

(56) References Cited

U.S. PATENT DOCUMENTS

| | | | |
|---|---|---|---|
| 2013/0257144 A1* | 10/2013 | Caldeira et al. | 307/9.1 |
| 2013/0285604 A1* | 10/2013 | Partovi | 320/108 |
| 2013/0343105 A1* | 12/2013 | Kosugi | 363/56.01 |
| 2014/0084830 A1* | 3/2014 | Djonga et al. | 318/400.42 |
| 2014/0092653 A1* | 4/2014 | Suzuki et al. | 363/55 |
| 2014/0103883 A1* | 4/2014 | Mitsutani | 320/162 |
| 2014/0218074 A1* | 8/2014 | Murata et al. | 327/109 |
| 2014/0265837 A1* | 9/2014 | Dobrow et al. | 315/77 |
| 2014/0358391 A1* | 12/2014 | Kakihara | 701/70 |
| 2015/0015197 A1* | 1/2015 | Mi et al. | 320/108 |

\* cited by examiner

CIRCUIT CONTROL DEVICE

CROSS-REFERENCE TO RELATED APPLICATION

This application is based on and claims the benefit of priority from earlier Japanese Patent Application No. 2013-19735 filed Feb. 4, 2013, the description of which is incorporated herein by reference.

BACKGROUND

1. Technical Field

This invention relates to a circuit control device that controls a semiconductor switching element.

2. Related Art

Conventionally, as a circuit control device that controls a semiconductor switching element, the one disclosed in the patent literature 1 (Japanese Patent Application Publication No. 2012-157223) is known. In the prior device, characteristics information of an insulated gate bipolar transistor (described as IGBT below) is stored in a memory; a voltage control circuit (a circuit for limiting voltage inputted to a control terminal of the IGBT) is controlled on the basis of the characteristic information stored in the memory.

As such characteristics information (for example, gate threshold voltage, capacitance between terminals etc.) of a semiconductor switching element, a rated value or a representative value thereof is denoted in a catalog etc. Alternatively, the characteristics information may be measured previously.

The characteristics information, however, might vary among individual components because of manufacturing. The characteristics information might vary because of aging too.

SUMMARY

The preset disclosure provides a circuit control device for controlling driving of a semiconductor switching element depending on actual characteristics of the switching element.

An exemplary embodiment provides a circuit control device controlling a semiconductor switching element having a control terminal and driven by voltage inputted to the control terminal. The circuit control device has an input voltage detector, a desired voltage setting portion and a control input generation portion. The input voltage detector detects an inputted voltage to the switching element. The desired voltage setting portion sets a desired value of the voltage to be inputted to the switching element. The control input generation portion is connected to the control terminal of the switching element, the control input generation portion generating control input to the switching element such that the value to be detected by the input voltage detector approaches the set desired value. The desired voltage setting portion sets the desired value of the voltage on the basis of predetermined characteristics information.

Thus, the circuit control device according to the invention can control driving of a semiconductor switching element depending on actual characteristics of the witching element. Accordingly, the circuit control device can improve switching loss etc.

DETAILED DESCRIPTION OF PREFERRED EMBODIMENTS

An embodiment according to the invention is now described, referring to the drawings.

Configurations

Figure 1:
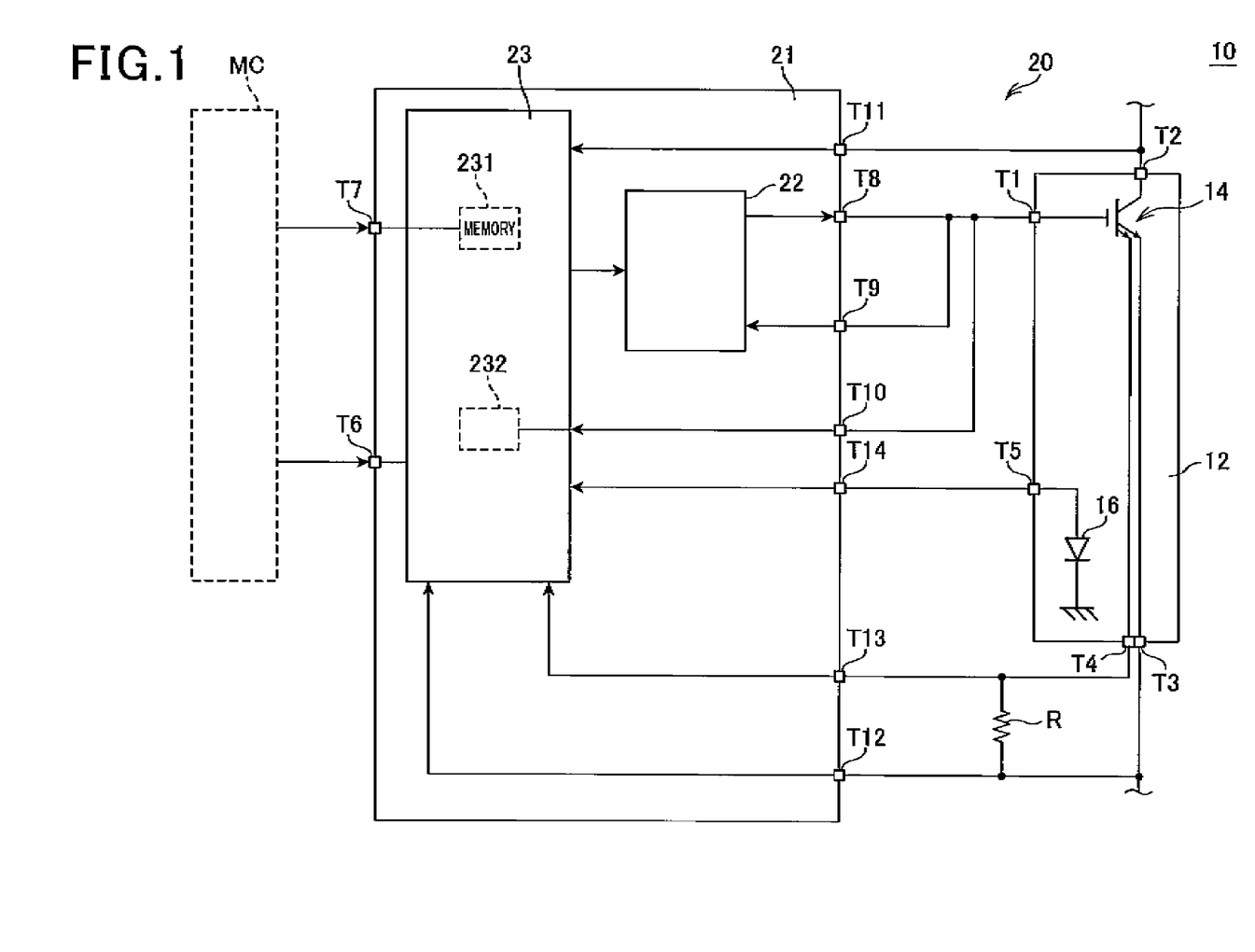
FIG. 1 is a schematic view showing configurations of a circuit control device according to an embodiment of the invention.

An in-vehicle electrical circuit 10 is a part of a power control unit mounted on a so-called hybrid vehicle. The power control unit is a device for controlling driving of a motor generator mounted on the above-described hybrid vehicle. In this embodiment, the power control unit has a plurality of power devices 12, and composes, for example, an inverter. The power device 12 is a packaged power module including at least a semiconductor switching element 14 and a sensor diode 16 for detecting temperature. In this embodiment, the power device 12 is card-shaped.

The switching element 14 is an IGBT as a so-called voltage controlled element, and has a gate terminal as a control terminal, a collector terminal and an emitter terminal as a pair of main terminals (input and output terminals). Here, the voltage controlled semiconductor switching element means a semiconductor switching element configured to be controlled to drive by voltage which is control input inputted to a control terminal. That is, the switching element 14 is controlled to switch by the voltage of the gate signal (control input to the gate terminal). In this embodiment, since the switching element 14 is an IGBT, the power device 12 has a free wheel diode (not shown) connected to the switching element 14 in inverse-parallel. The sensor diode 16 as a temperature sensor is disposed adjacent to the switching element 14 such that the sensor diode 16 generates output depending on the temperature (described as element temperature T below) of the switching element 14.

A circuit control device 20 is configured to control the actuation of the switching element 14. In this embodiment, each circuit control device 20 is provided corresponding to a respective power device 12, i.e. in a 1:1 relationship. The circuit control device 20 is connected to the power device 12 via terminals T1 to T5 of the power device 12. That is, the power device 12 is interchangeably attached to the circuit control device 20.

The terminal T1 is connected to the gate terminal of the switching element 14. The terminal T2 is connected to the collector terminal of the switching element 14. The terminal T2 is also connected to a collector wire provided outside of the power device 12. The terminal T3 is connected to the emitter terminal of the switching element 14. The terminal T3 is also connected to an emitter wire provided outside of the power device 12. The terminal T4 is connected to a sense terminal (which outputs minute electric current correlating with collector current) of the switching element 14. The terminal T4 is connected to an end of a sense register R provided outside of the power device 12. The other end of the sense register R is connected to the emitter wire. That is, the sense register R is connected to the emitter wire in parallel. The terminal T5 is connected to the sensor diode 16.

The circuit control device 20 has a driver IC 21. The driver IC 21 has terminals T6 to T14. The terminals T6 and T7 are connected to a main controller MC provided for controlling the operations of a plurality of power devices 12 and circuit control devices 20. That is, a plurality of circuit control devices 20 are connected to one main controller MC. On the other hand, the other terminals T8 to T14 are connected to the wire of the power device 12.

The main controller MC outputs drive control signals to the respective circuit control devices 20, depending on operating status of the hybrid vehicle. The main controller MC outputs characteristics information (Vth, Qg) of the switching elements 14 to the respective circuit control devices 20, as needed. Here, Vth means gate threshold voltage, and the Qg means gate capacitance (gate charge capacitance). The driver IC 21 receives the drive control signal through the terminal T6, and receives the characteristics information through the terminal T7.

The terminal T1 of the power device 12 is connected to the terminals T8, T9, T10 of the driver IC 21 through wire of the circuit control device 20 and an unshown connector (a connector for electrically communicating with the terminal T1 by contact). The terminal T11 of the driver IC 21 is connected to the collector wire. The terminal T12 of the driver IC 21 is connected to the emitter wire. The terminal T13 of the driver IC 21 is connected to the terminal T4 of the power device 12 through wire of the circuit control device 20 and an unshown connector. Similarly, the terminal T14 (as a temperature obtain portion) is connected to the terminal T5 of the power device 12 through wire and an unshown connector.

The driver IC 21 obtains (detects) the gate voltage Vg on the basis of the input to the terminal T10. The driver IC 21 obtains operating parameters (information on operating status) of the switching element 14, such as the element temperature T, the collector-emitter voltage Vce and the collector-emitter current Ice, on the basis of the inputs to the terminals T11 to T14 (as a first voltage obtain portion, a first current obtain portion and a switching time obtain portion). The driver IC 21 generates the gate signal on the basis of the drive control signal and the characteristics information received from the main controller MC through the terminals T6, T7, and the obtained (detected) gate voltage Vg and the operating parameters. The driver IC 21 outputs the generated gate signal to the gate terminal of the switching element 14 through the terminals T8 and T9, i.e. controls the electrical current flowing through the gate terminal.

Specifically, the driver IC 21 has a control input generation portion 22 and a drive control portion 23. The control input generation portion 22 is a circuit that generates the gate signal on the basis of the drive control signal under control of the drive control portion 23. That is, a current output terminal of the control input generation portion 22 is connected to the terminal T8 such that the control input generation portion 22 supplies electrical current to the gate terminal (i.e. charges the gate capacitor) when turning the switching element 14 on. A current input terminal of the control input generation portion 22 is connected to the terminal T9 such that the control input generation portion 22 supplies electrical current from the gate terminal (i.e. discharges the gate capacitor) when turning the switching element 14 off.

The control input generation portion 22 has an unshown constant current source and an FET for switching on etc., which are connected to the terminal T8. The control input generation portion 22 has an unshown FET for switching off and off resistor, which are connected to the terminal T9. Furthermore, the control input generation portion 22 has an unshown voltage damper etc. Such configuration of the control input generation portion 22 has been known, therefore, further detailed description is omitted (If needed, refer to, for example, Japanese Unexamined Patent Application Publication 2012-157137 and 2012-157223).

The drive control portion 23 is a so-called microcontroller (microcomputer) having a CPU, a ROM, a RAM and so on, and embedded in the driver IC 21. The drive control portion 23 is configured to control operation of each element on the basis of the inputted drive control signal etc., and serves as a desired voltage setting portion (means). Specifically, the drive control portion 23 has a non-volatile memory 231 and a gate voltage detector 232.

The non-volatile memory 231 is a memory which stores data etc., is rewritable during receiving electrical power, and keeps to storing the data during any loss of electrical power (flash ROM, EEPROM (trade mark) etc. correspond to this). The gate voltage detector 232 as an input voltage detector of the invention obtains (detects) the gate voltage Vg on the basis of the input to the terminal T10. The gate voltage Vg obtained with the gate voltage detector 232 is an actual obtained value (detected value) of voltage of the gate signal inputted (applied) to the gate terminal, described below as gate voltage obtained value Vg. Further, the gate voltage obtained value Vg at given time t is described as gate voltage obtained value Vg(t).

Figure 2:
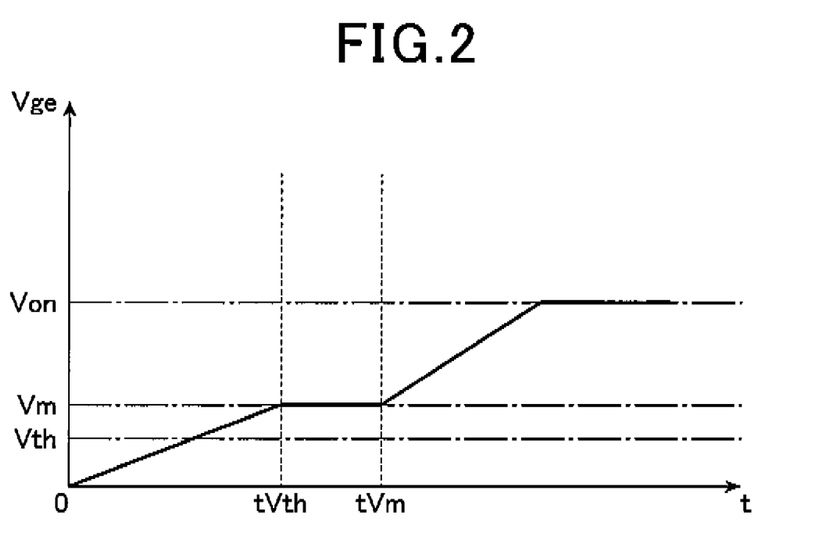
FIG. 2 is a view showing Vge map previously stored in the memory of FIG. 1.

The non-volatile memory 231 memorizes (stores) the above-described predetermined characteristics information which is inputted through the terminal T7 with the stored data rewritable. The non-volatile memory 231 stores Vge maps. The drive control portion 23 selects the Vge map on the basis of the characteristics information and the operating parameters to control the gate signal as described below. The Vge map is, as shown in FIG. 2, information on desired values of the gate voltage Vg, in this embodiment, defines change of voltage with time (transition with time or timing chart of the desired value of the gate voltage). The Vge map is previously made on the basis of results of an experiment or a computer simulation such that surge voltage is less than the withstand voltage and power loss is minimum.

A desired value of the gate voltage at given time t determined on the basis of the Vge map is described as a gate voltage desired value Vge(t) below. tVth in FIG. 2 shows time when the gate voltage desired value Vge reaches from zero to the gate threshold voltage Vth. Vm in FIG. 2 shows mirror voltage. tVm in FIG. 2 shows time when the gate voltage desired value Vge reaches from zero to the mirror voltage Vm. Von in FIG. 2 shows a full-ON voltage.

The drive control portion 23 set the gate voltage desired value Vge(t), on the basis of the characteristics information and the Vge map stored in the non-volatile memory 231 and the operating parameters inputted through the terminal T11 to T14. The drive control portion 23 controls the actuation of the control input generation portion 22 such that the gate voltage obtained value Vg(t) inputted to the terminal T10 becomes to (approaches) the gate voltage desired value Vge(t). The control input generation portion 22 generates the gate signal on the basis of the control of the drive control portion 23.

The driver IC 21 outputs the gate signal generated in the control input generation portion 22 to the gate terminal of the switching element 14 through the terminals T8 and T1. Furthermore, the drive control portion 23 configuring a malfunction detector of the invention determines (detects) whether a malfunction in the electrical circuit 10 (for example, fault of the switching element 14) occurs, on the basis of the Vge map and the gate voltage obtained value Vg.

Actuation

Figure 3:
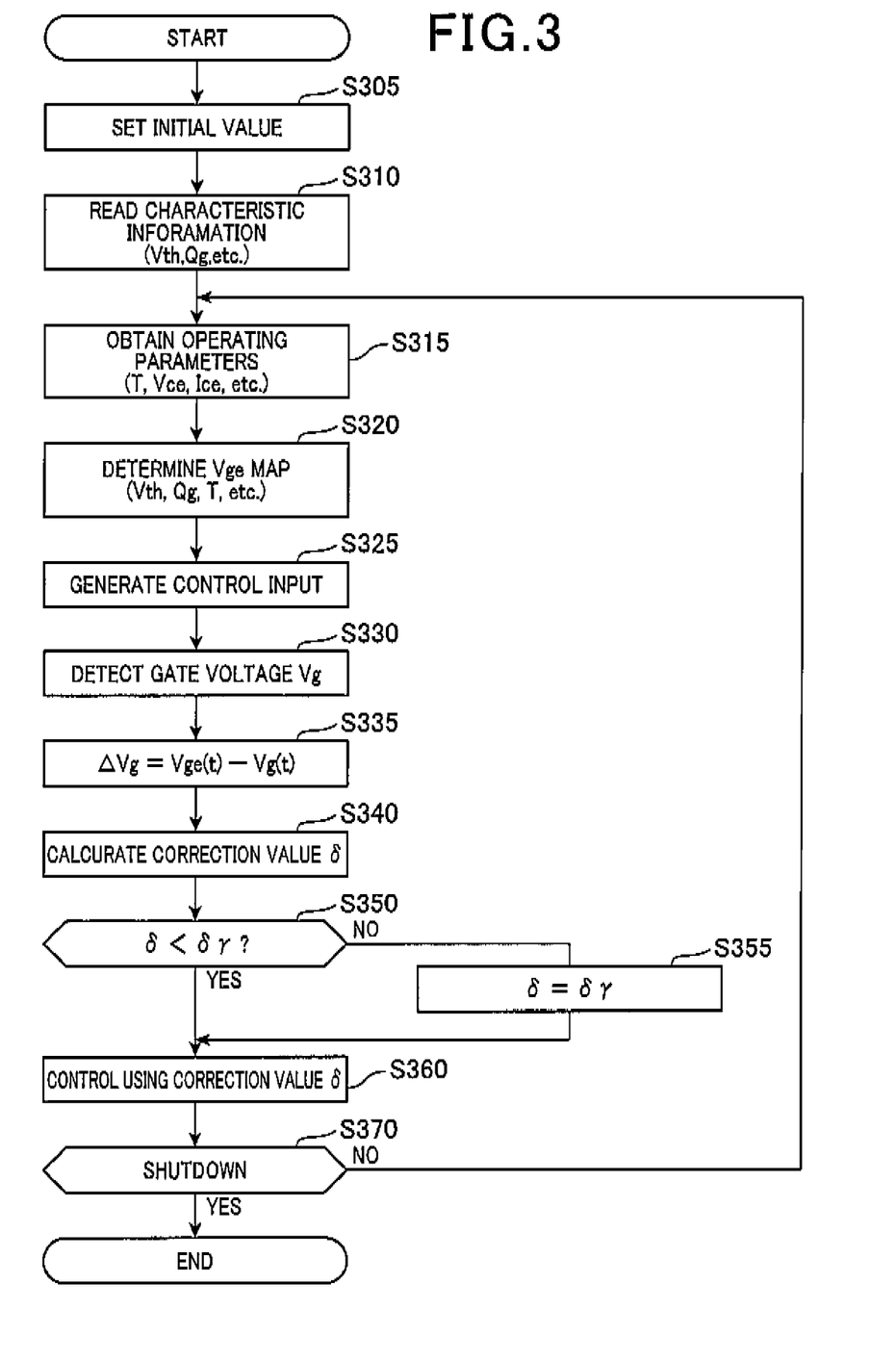
FIG. 3 is a flow chart showing an example of actuation of the circuit control device in FIG. 1.
Figure 4:
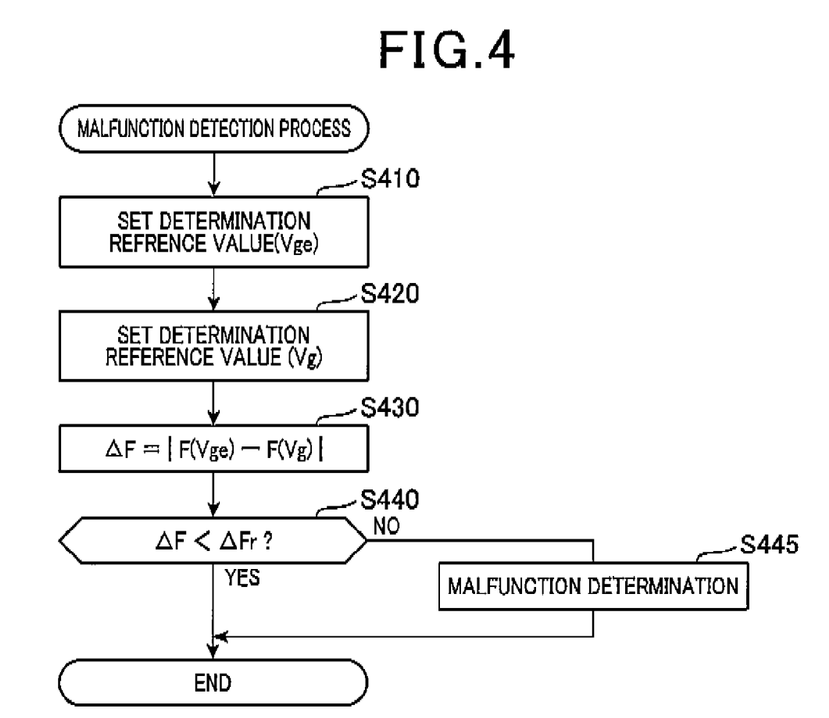
FIG. 4 is a flow chart showing an example of actuation of the circuit control device in FIG. 1.

Hereinafter, actuations and effects according to the configurations of the present embodiment are described. In FIGS. 3 and 4, step is abbreviated to S. The routines shown in FIGS. 3 and 4 are preliminarily stored on the ROM in the drive control portion 23. These routines are started by the CPU in the drive control portion 23 at a predetermined timing.

The routine in FIG. 3 is triggered by a predetermined operation such as turning an ignition switch on to start. When this routine is triggered, the CPU of the drive control portion 23 executes the following processes. At first, in step 305, the ECU sets an initial value of a controlled variable. Specifically, for example, In a case of constant current control, the controlled variable is the gate current Ig. Accordingly, the initial value of the gate current Ig is set in the step 305. The initial value is set in a safe range to keep the switching element 14 from breaking because of surge, considering an individual difference (manufacturing variations among the elements having the same part number) of the switching element 14 and aging (aged deterioration) etc. The initial value is previously stored in the non-volatile memory 231.

Next, in step 310, the CPU reads the characteristics information of the switching element 14 stored in the non-volatile memory 231. Subsequently, in step 315, the CPU obtains the operating parameters such as the element temperature T, stores them with time data (t) corresponding to them in the RAM. Further, in step 320, the CPU determines (chooses) the Vge map on the basis of the characteristics information read in the step 310 and the operating parameters obtained in the step 315. That is, the gate voltage desired value Vge is determined on the basis of the characteristics information and the operating parameters. After that, on the basis of the determined Vge map, the CPU generates the gate signal as the control input through the control input generation portion 22 (step 325). Thus, the drive control portion 23 controls switching (rising or falling) of the switching element, i.e. time change of the control input (driving rate) at switching, on the basis of the operating parameter correlating with loss, surge voltage, surge current, or characteristic information of the switching element.

In this embodiment, substantive feedback control of the gate input is executed as follows. That is, in step 330, the CPU obtains the gate voltage obtained value Vg(t) at current time t, relates it with the time data (t) of the time when obtaining, and stores it in the RAM. Next, in step 335, the CPU calculates the difference between the gate voltage obtained value Vg(t) and the gate voltage desired value Vge(t) as the error value ΔVg. Further, in step 340, the CPU calculates the correction value δ of the controlled variable on the basis of the error value ΔVg.

Here, in this embodiment, at the correction of the controlled variable, a restriction is provided for the amount of change. Specifically, the CPU determines whether or not the correction value δ calculated in the step 340 is less than a predetermined restriction value δr (step 350). When the correction value calculated in the step 340 is equal to or larger than the predetermined restriction value δr (step 350=NO), thereafter the flow proceeds to step 355, the CPU resets the correction value δ to the predetermined restriction value δr. On the other hand, when the correction value calculated in the step 340 is less than the predetermined restriction value Or (step 350=YES), the step 355 is skipped.

After that, the flow proceeds to step 360, the control (the correction of the controlled variable) is executed using the correction value δ such that the gate voltage obtained value Vg doses to the gate voltage desired value Vge. That is, the gate signal (the gate current Ig in the example of the constant current control) is controlled such that the gate voltage obtained value Vg closes to the gate voltage desired value Vge. Subsequently, the flow proceeds to step 370. In the step 370, the CPU determines whether or not there is an operation for the power shutdown. If there is no operation for the power shutdown (step 370=NO), the flows returns to the step 315, the above-described control is repeated. On the other hand, there is an operation for the power shutdown (step 370=YES), this routine is terminated until next iteration.

As described above, in this embodiment, the gate voltage desired value Vge is set on the basis of the characteristics information (Vth, Qg etc.) of the switching element 14 and the operating parameters such as the element temperature T, the collector-emitter voltage Vce, the collector-emitter current Ice. This gate voltage desired value Vge is an ideal value of the gate voltage where surge voltage is less than the withstand voltage of the switching element 14 and power loss is minimum. The gate signal is generated such that the actual gate voltage obtained value Vg closes to this gate voltage desired value Vge (Vge map).

Therefore, according to this embodiment, the switching element 14 is controlled well regardless of variations of the characteristics information due to the individual differences between components, aging, and further the change in the element temperature T etc. Furthermore, when the power device 12 is exchanged, the drive control is also performed depending on the actual characteristics of the switching element 14 provided in the new attached power device 12. Here, if the part number of the switching element 14 is changed because of the exchange of the power device 12, the new characteristics information is sent from the main controller MC to be stored in the non-volatile memory 231. Therefore, according to this embodiment, the switching element 14 is optimally controlled to be driven depending on the actual characteristics and operating status.

Next, the malfunction detection process is described, referring to the flow chart of FIG. 4. In this embodiment, the malfunction detection process is executed at the time when setting of the gate voltage desired value Vge during one way (from zero (initial value) to Von or from Von to zero (initial value)) has been finished as shown in FIG. 2. According to this embodiment, in the malfunction detection process, the drive control portion 23 determines whether or not the time from tVth to tVm is out of a given range and detects malfunction on the basis of the determination result.

When the malfunction detection process is started, at first, in step 410, the drive control portion 23 sets a determination reference value F (Vge) based on the gate voltage desired value Vge (Vge map). That is, in this embodiment, the determination reference value F (Vge) is the value of time difference from tVm to tVth (=tVm−tVth) in the Vge map. Thereafter, in step 420, the drive control portion 23 sets a determination reference value F(Vg) based on the gate voltage obtained value Vg. The determination reference value F(Vg) is a value of tVm−tVth, which is calculated on the basis of the time change (this is stored in the RAM as described above) of the actual gate voltage obtained value Vg.

Subsequently, in step 430, the drive control portion 23 calculates the difference value ΔF between the determination reference value F(Vge) based on the gate voltage desired value Vge and the determination reference value F(Vg) based on the gate voltage obtained value Vg. Thereafter, the drive control portion 23 determines whether or not the difference value ΔF is within a given range (i.e. whether or not it is less than a given value ΔFr). If the determination result of the step 440 is NO, the flow proceeds to step 445, and the drive control portion 23 determines malfunction has occurred, thereafter the flow is terminated until next iteration. On the other hand, if the determination result in step 440 is YES, the process of the step 445 is skipped, and the flow is terminated until next iteration.

Modifications

Hereinafter, some modifications are described. In the following descriptions, the same reference symbols are used for the parts corresponding to the parts of the above-described embodiment. Then, the explanations in the above-described embodiment are applied for the following modifications as long as there is no technical contradiction. A part of the above-described embodiment and a part or all of the following modifications may be arbitrarily combined as long as there is no technical contradiction.

The invention is not limited to the above-described specific described configuration. For example, the invention is not limited to the configuration having the power device 12. The circuit control device 20 may have the main controller MC. Alternatively, one common circuit control device 20 may be provided for a plurality of switching elements 14.

The present invention is not limited to the above-described specific actuation embodiment. For example, the present invention can be preferably applied to any of constant current control and constant voltage control of the voltage controlled switching element 14. The mirror voltage Vm or the full-ON voltage Von may be used as the determination reference value F in the malfunction detection process. Absolute values or signed numbers (positive-negative) may be used according to type of the determination reference F as the difference value ΔF in the malfunction detection process. In the malfunction detection process, malfunction in the driver IC (for example, malfunction of a FET included in the control input generation portion 22) may be detected too.

At setting the Vge map (setting the gate voltage desired value Vge), at least one of the collector-emitter voltage Vce (voltage between the main terminals) and the collector-emitter current Ice (current between main terminals) may be used, or they may not be used.

At setting the Vge map (the gate voltage desired value Vge), switching time of the switching element 14 may be used. In this case, the drive control portion 23 obtains the switching time in the step 310 and/or the step 315. As the switching time, for example, information on time which the switching element 14 needs for switching may be used, specifically, rise time tr, turn-on time ton, fall time tf or turn-off time toff may be used. It is noted that, the turn-on time ton is a sum of turn-on delay time td_on and the rise time tr, as known. Similarly, the turn-off time toff is a sum of turn-off delay time td_off and the fall time.

Here, actual switching time of the switching element 14 sometimes differs, according to driving conditions and variations due to individual differences at manufacturing, from a rated value or a representative value described in a catalog. Therefore, the circuit control device 20 may be configured to obtain an actual measured value of the switching time and set the Vge map on the basis of the actual measured value, according to the stored data in the RAM at performing the above-described routine in FIG. 3.

Figure 5:
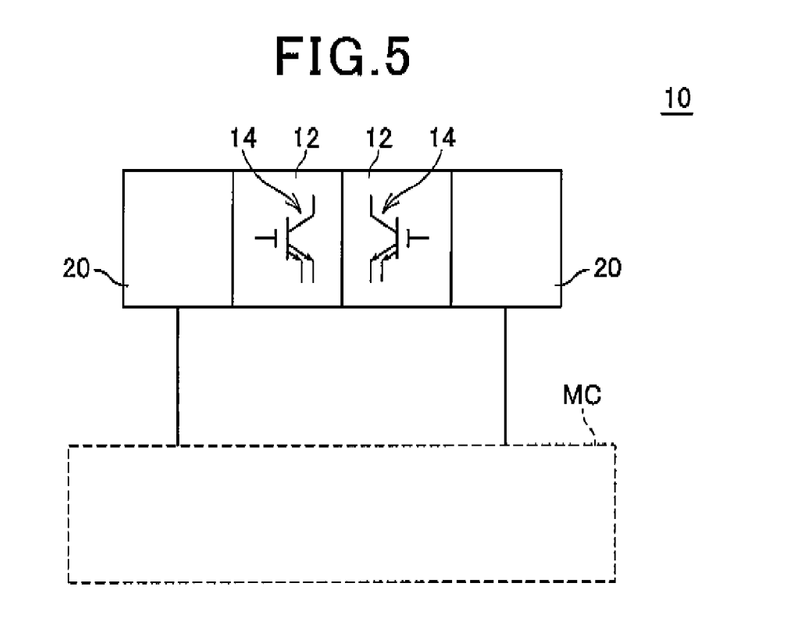
FIG. 5 is a schematic view showing configurations of a modification of the in-vehicle electrical circuit in FIG. 1.

As shown in FIG. 5, a plurality of switching elements 14 may be connected in parallel with each other (Although the case in FIG. 5 discloses two switching elements 14 connected in parallel with each other for the sake of shorthand of illustration, the present invention is not limited this.). In the example of FIG. 5, the switching elements 14 are connected in parallel with each other between the main terminals, and each gate terminal of each switching element 14 is connected to a respective circuit control device 20. In the case where the switching elements 14 connected in parallel, the circuit control device 10 may be configured to control (generate) the gate signal on the basis of the shortest and/or longest switching time among the switching elements 14 connected in parallel.

That is, control to suppress surge voltage on the basis of the switching time (the shortest switching time) of the switching element 14 which has the shortest switching time among these switching elements 14 may be executed. Further, control to suppress switching loss on the basis of the switching time (the longest switching time) of the switching element 14 which has the longest switching time among these switching elements 14 may be executed.

For example, the main controller MC obtains each actual measured value of the switching time from each circuit control device 20 corresponding to a respective one among a plurality of switching elements 14 (power device) connected in parallel. Thereafter, the main controller MC sends each circuit control device 20 information on the switching time of the corresponding switching element 14. The information is, for example, information on whether the switching time is shortest and whether the switching time is longest. Each circuit control device 20 which has received this information sets the control characteristic of the switching element 14 on the basis of this received information properly.

Figure 6:
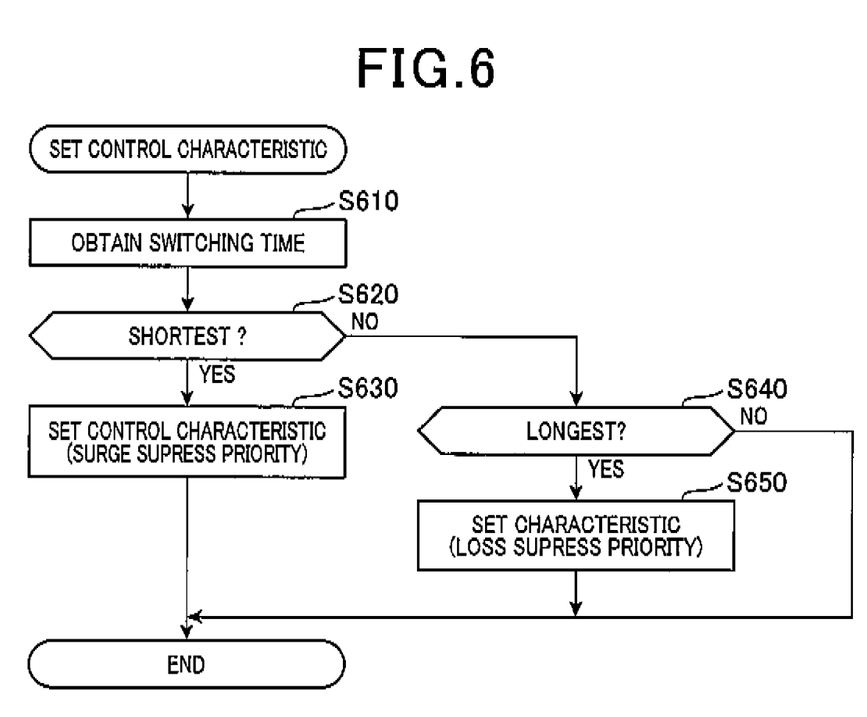
FIG. 6 is a flow chart showing an example of actuation of the electrical circuit in FIG. 5.

Specifically, the control characteristic setting process may be performed, for example, as shown in the flaw chart of FIG. 6. At first, in step 610, the circuit control device 20 obtains the above-described information on the switching time. Next, in step 620, the circuit control device 20 determines whether the switching time of the corresponding switching element 14 is the shortest switching time. When the switching time is the shortest (step 620=YES), the flow proceeds to step 630, and the circuit control device 20 sets the control characteristic to surge suppression priority. That is, the circuit control device 20 corrects the Vge map such that the surge voltage is reduced, i.e., performs a correction process of the Vge map such that loss is suppressed and that the rate of change of the current is reduced to as small value as possible.

On the other hand, if the switching time is not the shortest (step 620=NO), the flow proceeds to step 640. In the step 640, the circuit control device 20 determines whether the switching time of the corresponding switching element 14 is the longest switching time. If the switching time is the longest (step 640=YES), the flow proceeds to step 650. In the step 650, the circuit control device 20 sets the control characteristic to loss suppress priority. That is, the circuit control device 20 performs a correction process to maximize the switching speed within the range where the surge voltage is less than the withstand voltage. In other cases, i.e. if the switching time is neither the shortest nor the longest (step 620=NO, step 640=NO), the circuit control device 20 does not correct the Vge map.

Alternatively, the control characteristic setting process may be performed as follows. At first, the main controller MC obtains each switching time of each switching element 14.

Next, the main controller MC sets a predetermined switching time between the shortest switching time and the longest switching time among a plurality of switching elements. If setting the control characteristic to the surge suppress priority, the main controller MC sets the predetermined switching time to a slightly longer time than the center value between the longest switching time and the shortest switching time. On the other hand, if setting the control characteristic to the loss suppress priority, the main controller MC sets the predetermined time to a slightly shorter time than the above-described center value. After that, the main controller MC sends the set switching time to each circuit control device 20. Each circuit control device 20 sets the Vge map on the basis of the received switching time.

Alternatively, when the suppression of surge voltage has priority from the aspect of configurations of an in-vehicle electrical circuit 10, the main controller MC calculates correction value of the Vge map such that the surge voltage in the switching element 14 is equal to or less than the withstand voltage, depending the characteristics of the switching element 14 having the shortest switching time. Thereafter, the main controller MC sends the correction value to each circuit control device 20. This prevents fault of the element due to surge from occurring in a case where a plurality of switching elements 14 are connected in parallel.

The invention claimed is:

1. A circuit control device controlling a semiconductor switching element having a control terminal and driven by voltage inputted to the control terminal, comprising:
    an input voltage detector that detects inputted voltage to the switching element;
    a desired voltage setting portion that sets a desired value of the voltage to be inputted to the switching element on the basis of predetermined characteristics information of the switching element;
    a control input generation portion connected to the control terminal of the switching element, the control input generation portion generating control input to the switching element such that the value to be detected by the input voltage detector approaches the set desired value.

2. The circuit control device according to claim 1, further comprising a temperature obtain portion that obtains temperature of the switching element; wherein
    the desired voltage setting portion sets the desired value on the basis of the predetermined characteristics information and the temperature of the switching element obtained by the temperature obtain portion.

3. The circuit control device according to claim 1, further comprising a first voltage obtain portion that obtains voltage between main terminals of the switching element;
    the desired voltage setting portion sets the desired value on the basis of the predetermined characteristics information and the voltage between the main terminals obtained by the first voltage obtain portion.

4. The circuit control device according to claim 1, further comprising a first current obtain portion that obtains electrical current between main terminals of the switching element;
    the desired voltage setting portion sets the desired value on the basis of the predetermined characteristics information and the current between the main terminals obtained by the first current obtain portion.

5. The circuit control device according to claim 1, further comprising a switching time obtain portion that obtains switching time of the switching element in response to the control input;
    the desired voltage setting portion sets the desired value on the basis of the predetermined characteristics information and the switching time obtained by the switching time obtain portion.

6. The circuit control device according to claim 5, wherein:
    the semiconductor switching elements are connected in parallel with each other; and
    the desired voltage setting portion sets the desired value on the basis of the shortest switching time and/ or the longest switching time in the switching elements connected in parallel.

7. The circuit control device according to claim 1, further comprising, a malfunction detector that detects occurrence of malfunction in the switching element on the basis of the desired value of the voltage and the voltage detected by the input voltage detector.

8. The circuit control device according to claim 1, wherein the desired voltage setting portion sets the desired value, depending on time.

* * * * *